US012676196B2

(12) United States Patent
Hoang

(10) Patent No.: US 12,676,196 B2
(45) Date of Patent: Jul. 7, 2026

(54) LEVEL SHIFTER

(71) Applicant: eMemory Technology Inc., Hsin-Chu (TW)

(72) Inventor: Dung Le Tan Hoang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 77 days.

(21) Appl. No.: 18/757,441

(22) Filed: Jun. 27, 2024

(65) Prior Publication Data

US 2025/0062765 A1 Feb. 20, 2025

Related U.S. Application Data

(60) Provisional application No. 63/532,701, filed on Aug. 15, 2023.

(51) Int. Cl.
| | |
|---|---|
| *G11C 16/30* | (2006.01) |
| *G11C 5/14* | (2006.01) |
| *G11C 16/04* | (2006.01) |
| *G11C 16/08* | (2006.01) |
| *G11C 16/10* | (2006.01) |

(Continued)

(52) U.S. Cl.
CPC .............. *G11C 16/30* (2013.01); *G11C 5/147* (2013.01); *G11C 16/0483* (2013.01); *G11C 16/08* (2013.01); *G11C 16/10* (2013.01); *G11C 16/16* (2013.01); *G11C 16/26* (2013.01); *H03K 3/356113* (2013.01); *H03K 19/0013* (2013.01);

(Continued)

(58) Field of Classification Search
CPC ..... G11C 16/30; G11C 5/147; G11C 16/0483; G11C 16/08; G11C 16/10; G11C 16/16; G11C 16/26; G11C 16/28; H03K 3/356113; H03K 19/0013; H03K 19/018521; H03K 19/0185; H03K 19/018507; H03K 19/018528; H03K 19/018564; H03K 19/018571; H03K 19/018578; H03K 3/037; H03K 19/0175; H03K 19/017509; H03K 19/017545; G05F 3/262; G06F 3/00
See application file for complete search history.

(56) References Cited

U.S. PATENT DOCUMENTS

| | | | |
|---|---|---|---|
| 6,614,283 | B1 | 9/2003 | Wright |
| 7,199,617 | B1 | 4/2007 | Schrom |

(Continued)

*Primary Examiner* — Jung Kim
(74) *Attorney, Agent, or Firm* — Winston Hsu

(57) ABSTRACT

A level shifter which includes an inverter, first/second/third/fourth N-type transistors, first/second P-type transistors and a buffer is provided. The inverter inverts an input voltage to generate an inverted input voltage based on a first reference voltage. The first N-type transistor has a gate receiving the input voltage. The second N-type transistor has a gate receiving the inverted input voltage. The third N-type transistor has a source coupled to a drain of the first N-type transistor. The fourth N-type transistor has a source coupled to a drain of the second N-type transistor. Gates of the first/second P-type transistors are coupled to the drains of the second/first N-type transistors, respectively, and sources of the first/second P-type transistors receive a second reference voltage. The level shifter generates an output voltage according to a shifted voltage on the drain terminal of the third N-type transistor or the drain terminal of the fourth N-type transistor.

17 Claims, 4 Drawing Sheets

(51) Int. Cl.
    *G11C 16/16*         (2006.01)
    *G11C 16/26*         (2006.01)
    *H03K 3/356*        (2006.01)
    *H03K 19/00*       (2006.01)
    *H03K 19/0185*    (2006.01)
    *G05F 3/26*         (2006.01)

(52) U.S. Cl.
    CPC ..... *H03K 19/018521* (2013.01); *G05F 3/262*
                                  (2013.01)

(56)                 References Cited

U.S. PATENT DOCUMENTS

| | | | |
|---|---|---|---|
| 10,200,043 | B2 | 2/2019 | Koudate |
| 2008/0204079 | A1 | 8/2008 | Park |
| 2012/0112790 | A1* | 5/2012 | Huang ............ H03K 3/356182 |
| | | | 326/81 |
| 2019/0081622 | A1 | 3/2019 | Yagi |
| 2021/0036704 | A1 | 2/2021 | Mudimela Venkata |

* cited by examiner

LEVEL SHIFTER

CROSS REFERENCE TO RELATED APPLICATIONS

This application claims the benefit of U.S. Provisional Application No. 63/532,701, filed on Aug. 15, 2023. The content of the application is incorporated herein by reference.

BACKGROUND OF THE INVENTION

1. Field of the Invention

The present invention is related to ultra-low input voltage designs, and more particularly, to a level shifter which is applicable to an ultra-low power input voltage.

2. Description of the Prior Art

In a level shifter supporting a wide range with an ultra-low voltage design (e.g. with a supply voltage less than 0.55 volts), native input/output (IO) components can be used to meet requirement of operating under an ultra-low voltage. Not all of existing manufacturing processes provide the native IO components, however. Thus, thick-oxide components are adopted for the purpose of the ultra-low voltage operation under a condition where the native IO components are unavailable.

However, circuit design techniques for meeting the requirement of the ultra-low voltage operation proposed by related art typically greatly increase a circuit area of the level shifter, and these techniques fail to achieve sufficient reliability under the variation of high standard deviation. Thus, there is a need for a novel architecture of the level shifter, to solve the problem of the related art.

SUMMARY OF THE INVENTION

One objective of the present invention is to provide a level shifter, which can be implemented in a smaller circuit area by using thick-oxide components only and can achieve good reliability under high standard deviation process variation.

At least one embodiment of the present invention provides a level shifter. The level shifter comprises an inverter, a first N-type transistor, a second N-type transistor, a third N-type transistor, a fourth N-type transistor, a first P-type transistor, a second P-type transistor and a buffer. The inverter is configured to invert an input voltage of the level shifter to generate an inverted input voltage based on a first reference voltage. A gate terminal of the first N-type transistor is configured to receive the input voltage, and a source terminal of the first N-type transistor is coupled to a third reference voltage. A gate terminal of the second N-type transistor is configured to receive the inverted input voltage, and a source terminal of the second N-type transistor is coupled to the third reference voltage. A source terminal of the third N-type transistor is coupled to a drain terminal of the first N-type transistor, and a gate terminal of the third N-type transistor is configured to receive a bias voltage. A source terminal of the fourth N-type transistor is coupled to a drain terminal of the second N-type transistor, and a gate terminal of the fourth N-type transistor is configured to receive the bias voltage. A gate terminal of the first P-type transistor is coupled to the drain terminal of the second N-type transistor, a drain terminal of the first P-type transistor is coupled to a drain terminal of the third N-type transistor, and a source terminal of the first P-type transistor is configured to receive a second reference voltage. A gate terminal of the second P-type transistor is coupled to the drain terminal of the first N-type transistor, a drain terminal of the second P-type transistor is coupled to a drain terminal of the fourth N-type transistor, and a source terminal of the second P-type transistor is configured to receive the second reference voltage. More particularly, the level shifter generates an output voltage according to either a first shifted voltage on the drain terminal of the third N-type transistor or a second shifted voltage on the drain terminal of the fourth N-type transistor.

The level shifter provided by the embodiment of the present invention can lower an upper bound of a cross-coupled voltage on a cross-coupled node by isolating an output node and the cross-coupled node. As the cross-coupled voltage is lowered, the cross-coupled voltage can be pulled down without greatly increasing sizes of pull down components, thereby reduce the overall circuit area. Thus, the problem of the related art can be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
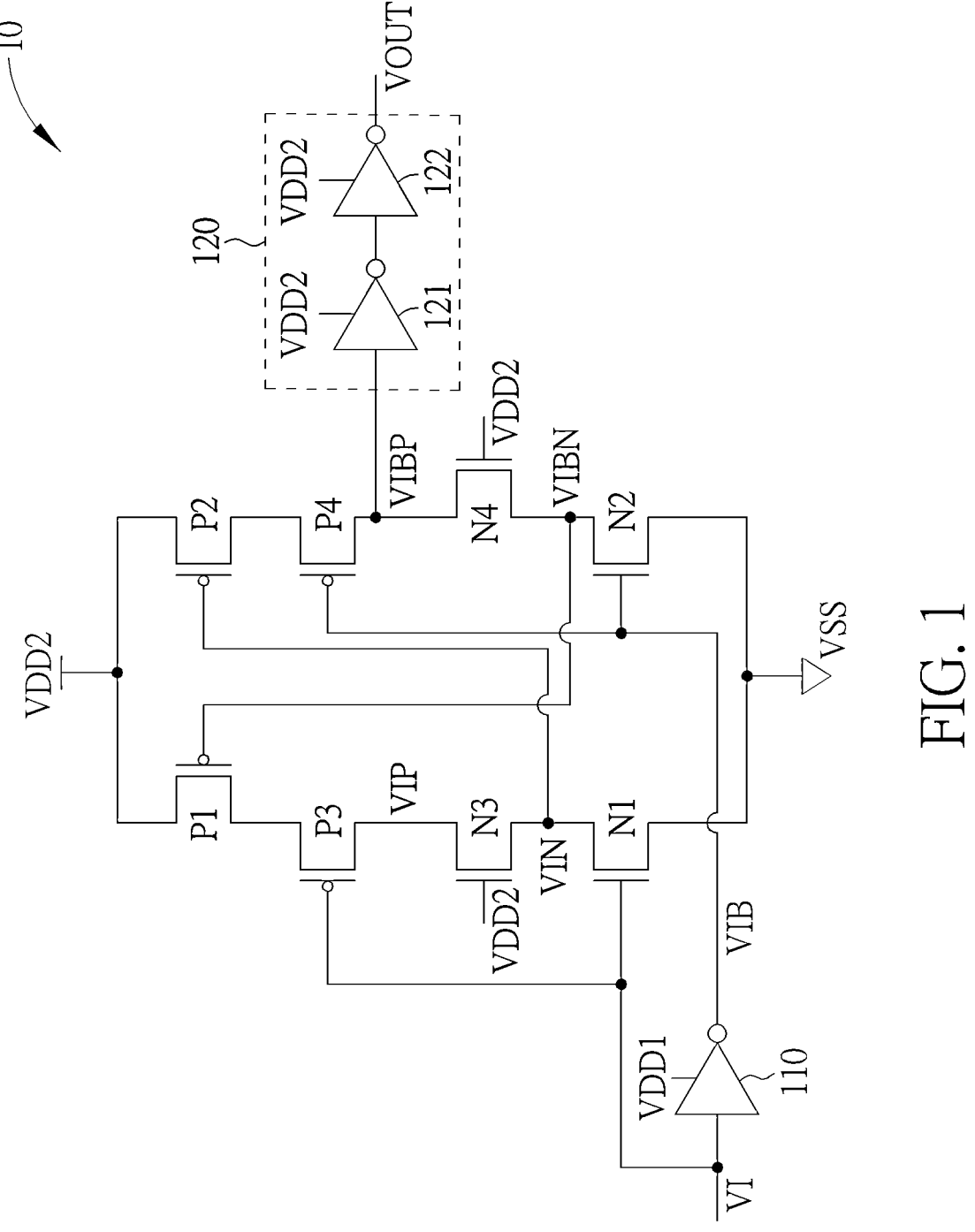
FIG. 1 is a diagram illustrating a level shifter according to an embodiment of the present invention.

FIG. 1 is a diagram illustrating a level shifter 10 according to an embodiment of the present invention. As shown in FIG. 1, the level shifter 10 may comprise an inverter 110 operating under a first reference voltage such as a reference voltage VDD1, a first N-type transistor such as an N-type transistor N1, a second N-type transistor such as an N-type transistor N2, a third N-type transistor such as an N-type transistor N3, a fourth N-type transistor such as an N-type transistor N4, a first P-type transistor such as a P-type transistor P1, a second P-type transistor such as a P-type transistor P2, and a buffer 120 operating under a second reference voltage such as a reference voltage VDD2. The inverter 110 is configured to invert an input voltage VI of the level shifter 10 to generate an inverted input voltage VIB based on the reference voltage VDD1. A gate terminal of the N-type transistor N1 is configured to receive the input voltage VI, and a source terminal of the N-type transistor N1 is coupled to a third reference voltage such as a reference voltage VSS. A gate terminal of the N-type transistor N2 is configured to receive the inverted input voltage VIB, and a source terminal of the N-type transistor N2 is coupled to the third reference voltage such as the reference voltage VSS. A source terminal of the N-type transistor N3 is coupled to a drain terminal of the N-type transistor N1. A source terminal of the N-type transistor N4 is coupled to a drain terminal of the N-type transistor N2. A gate terminal of the P-type transistor P1 is coupled to the drain terminal of the N-type transistor N2, a drain terminal of the P-type transistor P1 is coupled to a drain terminal of the N-type transistor N3, and a source terminal of the P-type transistor P1 is configured to receive the reference voltage VDD2. A gate terminal of the P-type transistor P2 is coupled to the drain terminal of the N-type transistor N1, a drain terminal of the P-type transistor P2 is coupled to a drain terminal of the N-type transistor N4, and a source terminal of the P-type transistor P2 is configured to receive the reference voltage VDD2. More particularly, the level shifter 10 may generate an output voltage VOUT according to either a first shifted voltage (e.g. VIP) on the drain terminal of the N-type transistor N3 or a second shifted voltage (e.g. VIBP) on the drain terminal of the N-type transistor N4. For example, the buffer 120 is configured to be driven by the shifted voltage VIP or the shifted voltage VIBP to generate the output voltage VOUT of the level shifter 10.

In this embodiment, the buffer 120 may comprises one or more inverters connected in series. For example, the buffer 120 may comprise an even number of inverters (e.g. the inverters 121 and 122 operating under the reference voltage VDD2) connected in series, where the buffer 120 is driven by the shifted voltage VIBP on the drain terminal of the N-type transistor N4 to generate an output voltage VOUT. In another example, the buffer 120 may comprise an odd number of inverter(s) connected in series, where the buffer 120 is driven by the shifted voltage VIP on the drain terminal of the N-type transistor N3 to generate an output voltage VOUT.

It should be noted that the reference voltage VDD1 may be an ultra-low voltage below 0.55 volt (V), which is close to an N-type threshold voltage Vtn12 of the N-type transistors N1 and N2. For properly enabling a state conversion of the level shifter 10, a pull-down current of the N-type transistor N1 needs to be greater than a pull-up current of the P-type transistor P1, in order to ensure that the N-type transistor N1 is able to pull down the cross-coupled voltage VIN when the input voltage VI is pulled up from VSS to VDD1, and a pull-down current of the N-type transistor N2 needs to be greater than a pull-up current of the P-type transistor P2, in order to ensure that the N-type transistor N2 is able to pull down the cross-coupled voltage VIBN when the input voltage VI is pulled down from VDD1 to VSS. In this embodiment, the level shifter 10 may further comprise a third P-type transistor such as a P-type transistor P3 and a fourth P-type transistor such as a P-type transistor P4, in order to limit the pull-up current of any of the P-type transistors P1 and P2. The P-type transistor P3 is coupled between a drain terminal of the P-type transistor P1 and the drain terminal of the N-type transistor N3, making the drain terminal of the P-type transistor P1 coupled to the drain terminal of the N-type transistor N3 via the P-type transistor P3, where a gate terminal of the P-type transistor P3 is configured to receive the input voltage VI. The P-type transistor P4 is coupled between a drain terminal of the P-type transistor P2 and the drain terminal of the N-type transistor N4, making the drain terminal of the P-type transistor P2 coupled to the drain terminal of the N-type transistor N4 via the P-type transistor P4, where a gate terminal of the P-type transistor P4 is configured to receive the inverted input voltage VIB. When the input voltage VI is pulled up from the third reference voltage such as the reference voltage VSS to the reference voltage VDD1 (which means the inverted input voltage VIB is pulled down from the reference voltage VDD1 to the reference voltage VSS), the pull-up current of the P-type transistor P1 may be limited by the P-type transistor P3 (which is turned off by the input voltage VI). When the input voltage VI is pulled down from the reference voltage VDD1 to the reference voltage VSS (which means the inverted input voltage VIB is pulled up from the reference voltage VSS to the reference voltage VDD1), the pull-up current of the P-type transistor P2 may be limited by the P-type transistor P4 (which is turned off by the inverted input voltage VIB).

Thus, a pull-up current of the P-type transistors P3 (or the pull-up current of the P-type transistors P1) can be less than the pull-down current of the N-type transistor N1, and a pull-up current of the P-type transistor P4 (or the pull-up current of the P-type transistor P2) can be less than the pull-down current of the N-type transistor N2. More particularly, the pull-up current of each of the P-type transistors P3 and P4 may be minimized by minimizing channel widths of the P-type transistors P3 and P4 and maximizing channel lengths of the P-type transistors P3 and P4 according to a design rule of a semiconductor process which is utilized for manufacturing the level shifter 10.

In this embodiment, gate terminals of the N-type transistors N3 and N4 are configured to receive a bias voltage and the N-type transistors N3 and N4 are controlled to be turned on by the bias voltage, where an upper bound of a cross-coupled voltage on each of the drain terminals of the N-type transistors N1 and N2 (e.g. each of the cross-coupled voltages VIN and VIBN) is controlled according to the bias voltage and an N-type threshold voltage Vtn34 of each of the N-type transistor N3 and the N-type transistor N4. More particularly, the upper bound of the cross-coupled voltages VIN and VIBN may be equal to the bias voltage minus the N-type threshold voltage Vtn34, where the upper bound of the cross-coupled voltages VIN and VIBN is preferred to be less than the reference voltage VDD2. In this embodiment, the bias voltage may be equal to the reference voltage VDD2, which means the gate terminals of the N-type transistors N3 and N4 are configured to receive the reference voltage VDD2, thereby making the upper bound of the cross-coupled voltages VIN and VIBN be equal to (VDD2-Vtn34).

Figure 2:
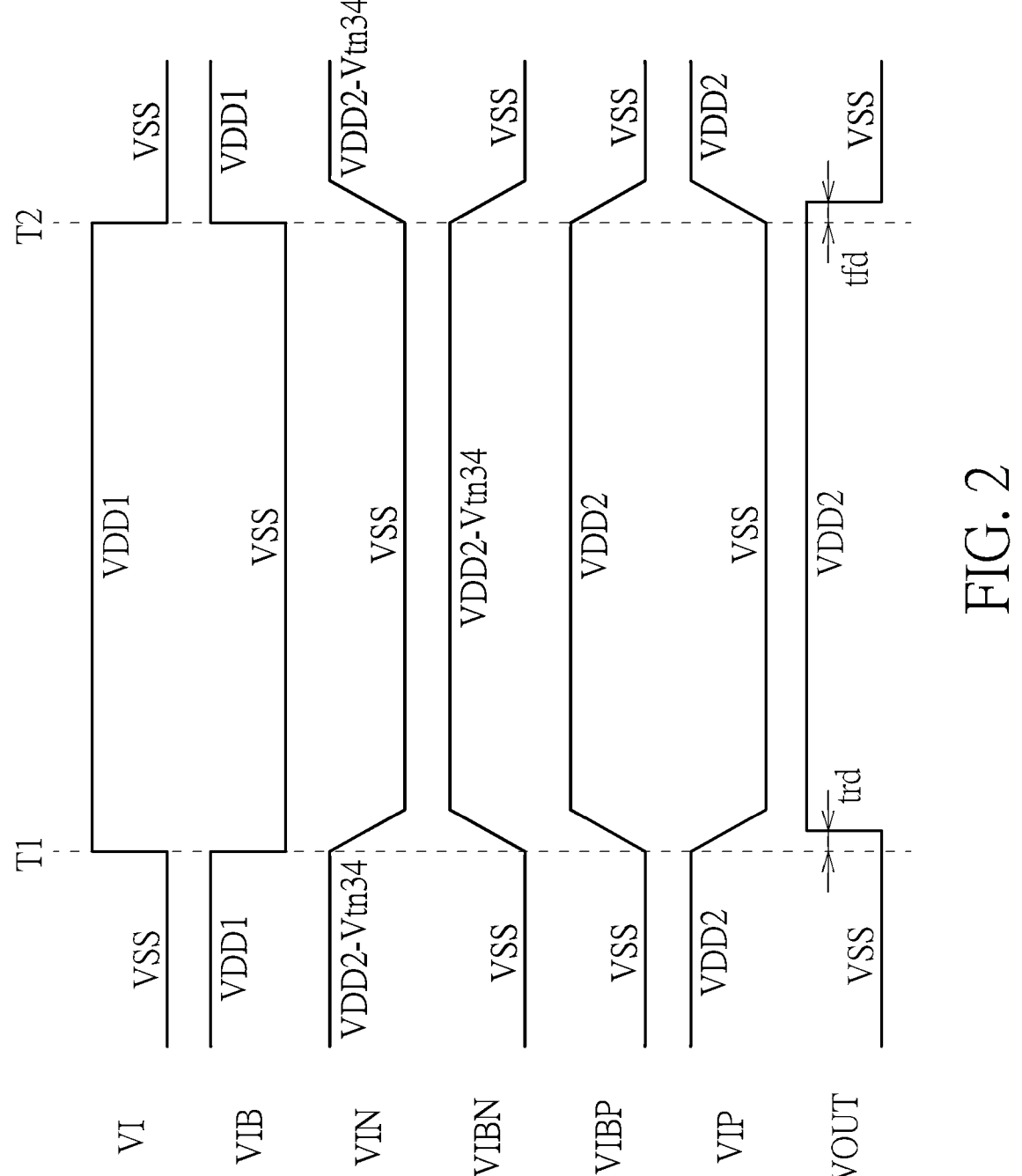
FIG. 2 is a diagram illustrating waveforms of some voltages in the level shifter shown in FIG. 1 according to an embodiment of the present invention.

FIG. 2 is a diagram illustrating waveform of some voltages (e.g. the input voltage VI, the inverted input voltage VIB, the cross-coupled voltages VIN and VIBN, the shifted voltage VIBP and VIP, and the output voltage VOUT) in the level shifter 10 shown in FIG. 1 according to an embodiment of the present invention. When the input voltage VI is pulled up from VSS to VDD1 at a time point T1, the inverted input voltage VIB is pulled down from VDD1 to VSS, where the N-type transistor N2 is turned off, and the P-type transistor P3 is turned off to limit the pull-up current of the P-type transistors P1 and P3, allowing the N-type transistor N1 to be turned on to start pull down the cross-coupled voltage VIN on the drain terminal of the N-type transistor N1 from (VDD2-Vtn34) to VSS. As the cross-coupled voltage VIN and the inverted input voltage VIB are pulled down to VSS, both the P-type transistors P2 and P4 are turned on to pull up the shifted voltage VIBP from VSS to VDD2. In addition, as the N-type transistor N4 is turned on, the cross-coupled voltage VIBN on the drain terminal of the N-type transistor N2 is pulled up from VSS to (VDD2-Vtn34) when the shifted voltage VIBP is pulled up to VDD2, and the P-type transistor P1 is thereby tuned off. In addition, as the N-type transistor N3 is turned on, the shifted voltage VIP on the drain terminal of the N-type transistor N3 may be pulled down from VDD2 to VSS when the cross-coupled voltage VIN is pulled down to VSS. As mentioned above, the shifted voltage VIP on the drain terminal of the N-type transistor N3 may be pulled down from VDD2 to VSS and the shifted voltage VIBP on the drain terminal of the N-type transistor N4 may be pulled up from VSS to VDD2, making the output voltage VOUT pulled up from VSS to VDD2 with a rising delay trd resulted from the buffer 120 relative to the time point T1.

When the input voltage VI is pulled down from VDD1 to VSS at a time point T2, the inverted input voltage VIB is pulled up from VSS to VDD1, where the N-type transistor N1 is turned off, and the P-type transistor P4 is turned off to limit the pull-up current of the P-type transistors P2 and P4, allowing the N-type transistor N2 to be turned on to start pull down the cross-coupled voltage VIBN on the drain terminal of the N-type transistor N2 from (VDD2-Vtn34) to VSS. As the cross-coupled voltage VIBN and the input voltage VI are pulled down to VSS, both the P-type transistors P1 and P3 are turned on to pull up the shifted voltage VIP from VSS to VDD2. In addition, as the N-type transistor N3 is tuned on, the cross-coupled voltage VIN on the drain terminal of the N-type transistor N1 is pulled up from VSS to (VDD2-Vtn34) when the shifted voltage VIP is pulled up to VDD2, and the P-type transistor P2 is thereby tuned off. In addition, as the N-type transistor N4 is turned on, the shifted voltage VIBP on the drain terminal of the N-type transistor N4 may be pulled down from VDD2 to VSS when the cross-coupled voltage VIBN is pulled down to VSS. As mentioned above, the shifted voltage VIP on the drain terminal of the N-type transistor N3 may be pulled up from VSS to VDD2 and the shifted voltage VIBP on the drain terminal of the N-type transistor N4 may be pulled down from VDD2 to VSS, making the output voltage VOUT pulled down from VDD2 to VSS with a falling delay tfd resulted from the buffer 120 relative to the time point T2.

It should be noted that as the upper bound of the cross-coupled voltages VIN and VIBN is (VDD2-Vtn34) instead of VDD2, the P-type transistors P1 and P2 may introduce direct currents (DC currents) if (VDD2-Vtn34)< (VDD2-Vtp12), where Vtp12 represents a P-type threshold voltage of the P-type transistors P1 and P2. In some embodiment, sizes of the P-type transistors P1 and P2 and/or sizes of the N-type transistors N3 and N4 may be determined to ensure that (VDD2-Vtn34) is not less than (VDD2-Vtp12) in order to reduce the DC currents as much as possible.

Figure 3:
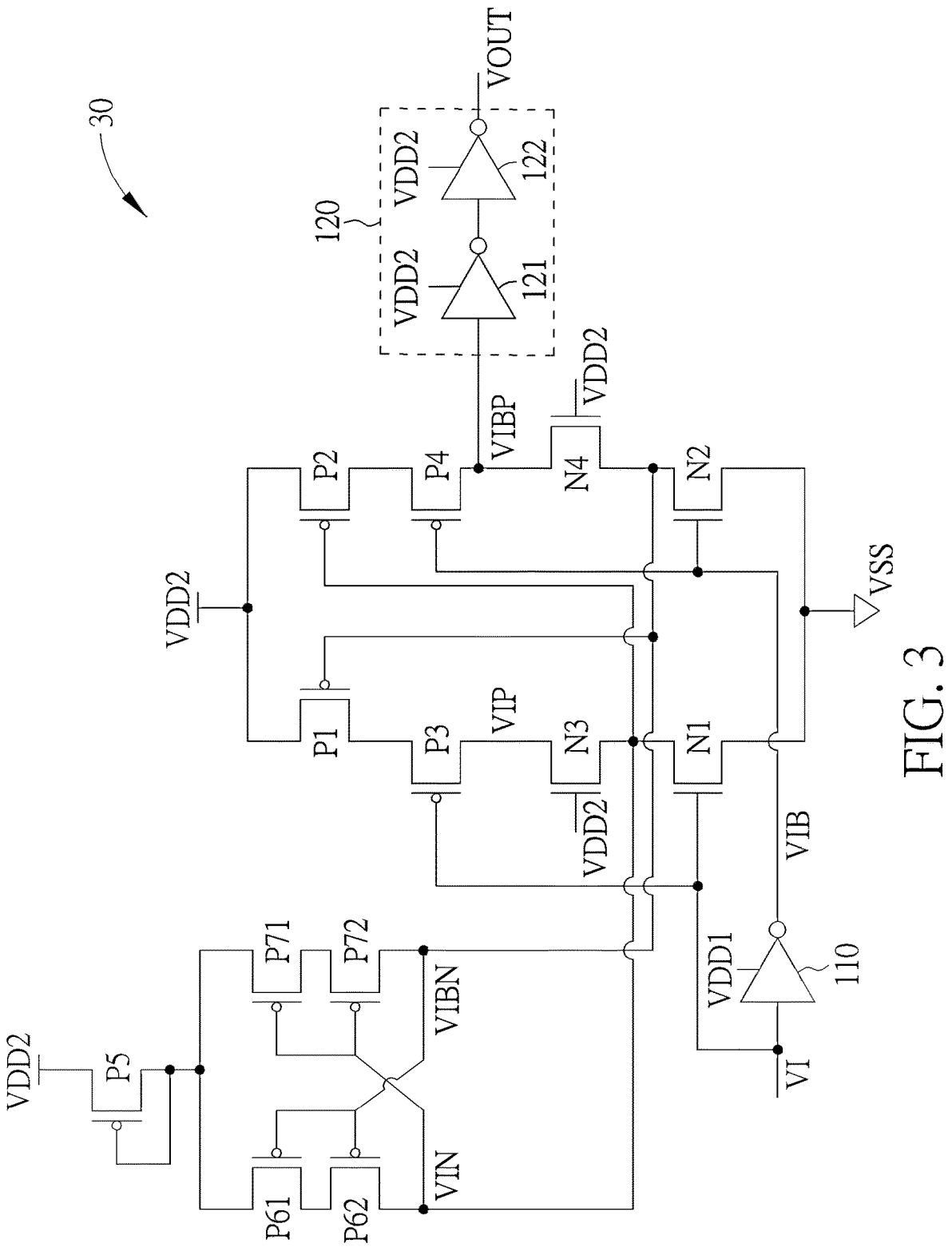
FIG. 3 is a diagram illustrating a level shifter according to an embodiment of the present invention.

FIG. 3 is a diagram illustrating a level shifter 30 according to an embodiment of the present invention. As shown in FIG. 3 the level shifter 30 may comprise the inverter 110, the N-type transistor N1, N2, N3 and N4, the P-type transistors P1, P2, P3 and P4, and the buffer 120, where operations of these components are the same as that illustrated in the embodiment of FIG. 1, and will not be repeated here for brevity. In this embodiment, the level shifter 30 may further comprise a fifth P-type transistor such as a P-type transistor P5, at least one sixth P-type transistor such as P-type transistors P61 and P62, and at least one seventh P-type transistor such as P-type transistors P71 and P72. A gate terminal of the P-type transistor P5 is coupled to a drain terminal of the P-type transistor P5, and a source terminal of the P-type transistor P5 is configured to receive the reference voltage VDD2. The P-type transistors P61 and P62 are coupled between the drain terminal of the P-type transistor P5 and the drain terminal of the N-type transistor N1, where the P-type transistor P61 is coupled between the drain terminal of the P-type transistor P5 and a source terminal of the P-type transistor P62, and the P-type transistor P62 is coupled between a drain terminal of the P-type transistor P61 and the drain terminal of the N-type transistor N1. The P-type transistors P71 and P72 are coupled between the drain terminal of the P-type transistor P5 and the drain terminal of the N-type transistor N2, where the P-type transistor P71 is coupled between the drain terminal of the P-type transistor P5 and a source terminal of the P-type transistor P72, and the P-type transistor P72 is coupled between a drain terminal of the P-type transistor P71 and the drain terminal of the N-type transistor N2. In addition, gate terminals of the P-type transistors P61 and P62 are coupled to the drain terminal of the N-type transistor N2, and gate terminals of the P-type transistors P71 and P72 are coupled to the drain terminal of the N-type transistor N1. In some embodiment, the P-type transistor P61 and P62 may be combined as one P-type transistor, and the P-type transistor P71 and P72 may be combined as one P-type transistor, but the present invention is not limited thereto.

It should be noted that the pull-up current of the P-type transistor P1 (or the pull-up current of the P-type transistor P3) plus a pull-up current of the P-type transistors P61 and P62 may be less than the pull-down current of the N-type transistor N1, in order to ensure that the N-type transistor N1 is able to pull down the cross-coupled voltage VIN when the input voltage VI is pulled up from VSS to VDD1. Similarly, the pull-up current of the P-type transistor P2 (or the pull-up current of the P-type transistor P4) plus a pull-up current of the P-type transistors P71 and P72 may be less than the pull-down current of the N-type transistor N2, in order to ensure that the N-type transistor N2 is able to pull down the cross-coupled voltage VIBN when the input voltage VI is pulled down from VDD1 to VSS. Thus, the P-type transistors P61, P62, P71 and P72 are preferably weak components. More particularly, the pull-up current of the P-type transistors P61 and P62 and the pull-up current of the P-type transistor P71 and P72 can be minimized by minimizing channel widths of the P-type transistors P61, P62, P71 and P72 and maximizing channel lengths of the P-type transistors P61, P62, P71 and P72 according to a design rule of a semiconductor process which is utilized for manufacturing the level shifter 30.

In this embodiment, sizes of the P-type transistor P5, P1 and P2 are identical, thereby making a P-type threshold voltage Vtp5 of the P-type transistor P5 is equal to the P-type threshold voltage Vtp12 of the P-type transistors P1 and P2. According to the architecture of the level shifter 30 shown in FIG. 3, the upper bound of each of the cross-coupled voltage VIN on the drain terminals of the N-type transistor N1 and the cross-coupled voltage VIBN on the drain terminals of the N-type transistor N2 can be controlled according to the reference voltage VDD2 and the P-type threshold voltage Vtp5 of the P-type transistor P5. More particularly, the upper bound of the cross-coupled voltages VIN and VIBN may be equal to (VDD2-Vtp5).

It should be noted that as the upper bound of the shifted voltages VIN and VIBN is (VDD2-Vtp5) (which is equal to (VDD2-Vtp12) instead of (VDD2-Vtn34) and is able to turn off the P-type transistors P1 and P2 or is able to make the P-type transistors P1 and P2 enter a sub-threshold region, and the DC currents introduced by the P-type transistors P1 and P2 of the level shifter 30 shown in FIG. 3 may be reduced in comparison with the DC currents introduced by the P-type transistors P1 and P2 of the level shifter 10 shown in FIG. 1.

Figure 4:
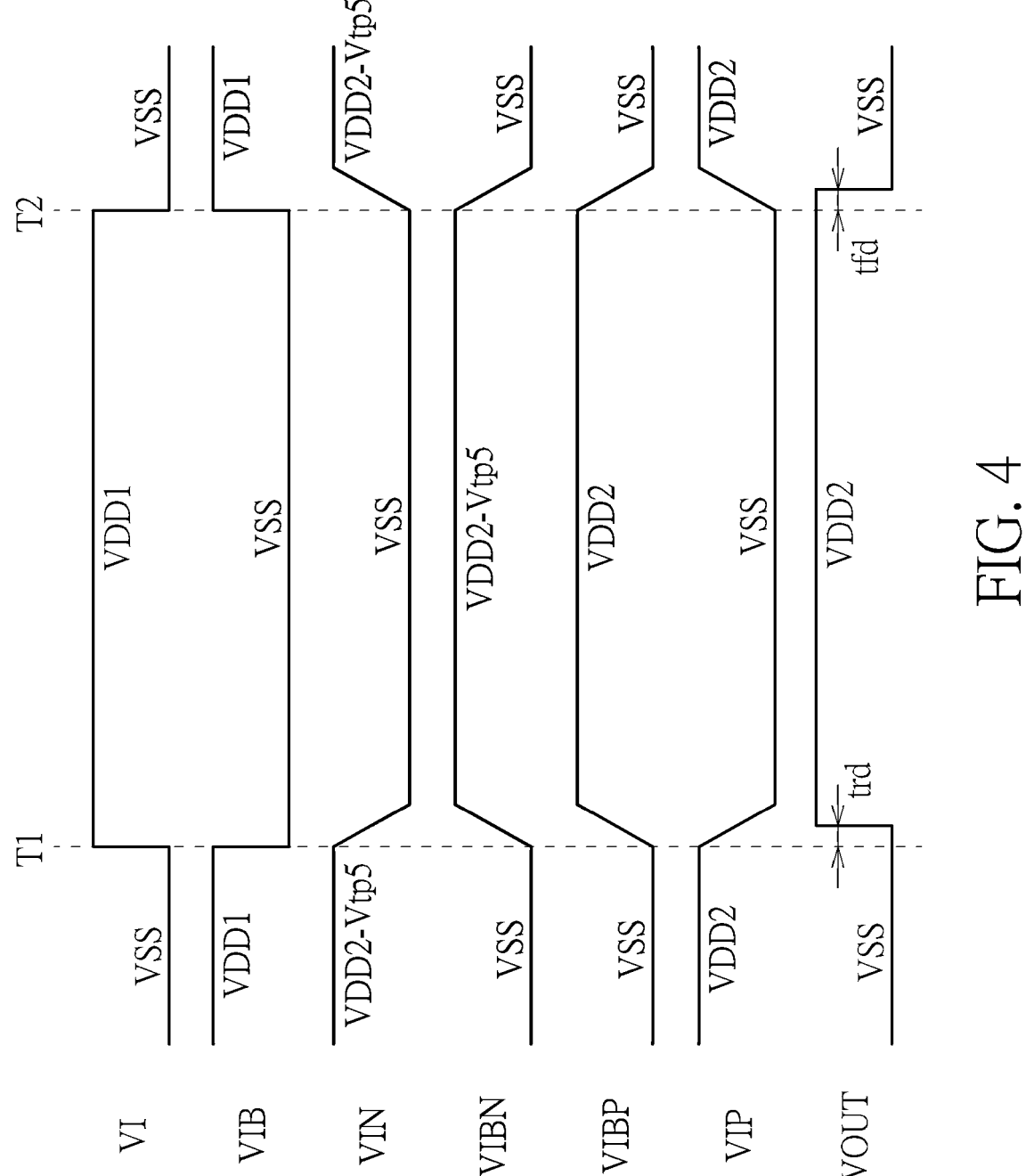
FIG. 4 is a diagram illustrating waveforms of some voltages in the level shifter shown in FIG. 3 according to an embodiment of the present invention.

FIG. 4 is a diagram illustrating waveforms of some voltages (e.g. the input voltage VI, the inverted input voltage VIB, the cross-coupled voltages VIN and VIBN, the shifted voltage VIBP and VIP, and the output voltage VOUT) in the level shifter shown in FIG. 3 according to an embodiment of the present invention. Note that the only difference between the embodiments of FIG. 2 and FIG. 4 is the upper bound of the cross-coupled voltages VIN and VIBN. When the input voltage VI is pulled up from VSS to VDD1 at the time point T1, the N-type transistor N1 is turned on, and the cross-coupled voltage VIN on the drain terminal of the N-type transistor N1 is pulled down from (VDD2-Vtp5) to VSS. As the cross-coupled voltage VIN is pulled down to VSS, the P-type transistors P71 and P72 are turned on, where the P-type transistors P71 and P72 are weak components, which make the P-type transistor P5 operate in the sub-threshold region, thereby making the gate terminal and the drain terminal of the P-type transistor P5 self-biased at (VDD2-Vtp5). As the P-type transistors P71 and P72 are turned on, the cross-coupled voltage VIBN on the drain terminal of the N-type transistor N2 and the drain terminal of the P-type transistor P72 is pulled up from VSS to (VDD2-Vtp5), and the P-type transistors P61 and P62 are therefore tuned off, where the shifted voltage VIP on the drain terminal of the N-type transistor N3 is pulled down from VDD2 to VSS and the shifted voltage VIBP on the drain terminal of the N-type transistor N4 is pulled up from VSS to VDD2. Other details such as bias conditions of the other transistors may be deduced by analogy based on the embodiment of FIG. 2, where the difference between the embodiments of FIG. 2 and FIG. 4 is that the cross-coupled voltage VIBN is pulled up to (VDD2-Vtp5) at the time point T1, which makes the P-type transistor P1 turned off or enter the sub-threshold region, in order to reduce the DC current.

When the input voltage VI is pulled down from VDD1 to VSS (which means the inverted input voltage VIB is pulled up from VSS to VDD1) at the time point T2, the N-type transistor N2 is turned on, and the cross-coupled voltage VIBN on the drain terminal of the N-type transistor N2 is pulled down from (VDD2-Vtp5) to VSS. As the cross-coupled voltage VIBN is pulled down to VSS, the P-type transistors P61 and P62 are turned on, where the P-type transistors P61 and P62 are weak components, which make the P-type transistor P5 operate in the sub-threshold region, thereby making the gate terminal and the drain terminal of the P-type transistor P5 self-biased at (VDD2-Vtp5). As the P-type transistors P61 and P62 are turned on, the cross-coupled voltage VIN on the drain terminal of the N-type transistor N1 and the drain terminal of the P-type transistor P62 is pulled up from VSS to (VDD2-Vtp5), and the P-type transistors P71 and P72 are therefore tuned off, where the shifted voltage VIBP on the drain terminal of the N-type transistor N4 is pulled down from VDD2 to VSS and the shifted voltage VIP on the drain terminal of the N-type transistor N3 is pulled up from VSS to VDD2. Other details such as bias conditions of the other transistors may be deduced by analogy based on the embodiment of FIG. 2, where the difference between the embodiments of FIG. 2 and FIG. 4 is that the cross-coupled voltage VIN is pulled up to (VDD2-Vtp5) at the time point T2, which makes the P-type transistor P2 turned off or enter the sub-threshold region, in order to reduce the DC current.

To summarize, both of the level shifters 10 and 30 can lower the upper bound of the cross-coupled voltages VIN and VIBN, which allows the sizes of the N-type transistors N1 and N2 to be greatly reduced in comparison with the related art when operating under the ultra-low voltage. In detail, the level shifter 10 shown in FIG. 1 is aimed at achieving the smallest circuit area and the best performance (e.g. the least delay), and the level shifter 30 shown in FIG. 3 is aimed at achieving the least DC currents and the best reliability (e.g. the highest tolerance to process variation). More particularly, both of the level shifters 10 and 30 can have smaller circuit areas, better performance, less power consumptions and better reliabilities in comparison with the related art. Thus, the embodiments of the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifter, comprising:
   an inverter, configured to invert an input voltage of the level shifter to generate an inverted input voltage based on a first reference voltage;
   a first N-type transistor, wherein a gate terminal of the first N-type transistor is configured to receive the input voltage, and a source terminal of the first N-type transistor is coupled to a third reference voltage;
   a second N-type transistor, wherein a gate terminal of the second N-type transistor is configured to receive the inverted input voltage, and a source terminal of the second N-type transistor is coupled to the third reference voltage;
   a third N-type transistor, wherein a source terminal of the third N-type transistor is coupled to a drain terminal of the first N-type transistor, and a gate terminal of the third N-type transistor is configured to receive a bias voltage;
   a fourth N-type transistor, wherein a source terminal of the fourth N-type transistor is coupled to a drain terminal of the second N-type transistor, and a gate terminal of the fourth N-type transistor is configured to receive the bias voltage;
   a first P-type transistor, wherein a gate terminal of the first P-type transistor is coupled to the drain terminal of the second N-type transistor, a drain terminal of the first P-type transistor is coupled to a drain terminal of the third N-type transistor, and a source terminal of the first P-type transistor is configured to receive a second reference voltage; and
   a second P-type transistor, wherein a gate terminal of the second P-type transistor is coupled to the drain terminal of the first N-type transistor, a drain terminal of the second P-type transistor is coupled to a drain terminal of the fourth N-type transistor, and a source terminal of the second P-type transistor is configured to receive the second reference voltage;
   wherein the level shifter generates an output voltage according to either a first shifted voltage on the drain terminal of the third N-type transistor or a second shifted voltage on the drain terminal of the fourth N-type transistor, an upper bound of a cross-coupled voltage on each of the drain terminals of the first N-type transistor and the second N-type transistor is controlled according to the bias voltage and an N-type threshold voltage of each of the third N-type transistor and the fourth N-type transistor, the bias voltage is equal to the second reference voltage, the upper bound of the cross-coupled voltage is equal to the bias voltage minus the N-type threshold voltage, and the upper bound of the cross-coupled voltage is less than the second reference voltage.

2. The level shifter of claim 1, wherein a pull-down current of each of the first N-type transistor and the second N-type transistor is greater than a pull-up current of each of the first P-type transistor and the second P-type transistor.

3. The level shifter of claim 1, further comprising:

a third P-type transistor, coupled between a drain terminal of the first P-type transistor and the drain terminal of the third N-type transistor, wherein a gate terminal of the third P-type transistor is configured to receive the input voltage; and a fourth P-type transistor, coupled between a drain terminal of the second P-type transistor and the drain terminal of the fourth N-type transistor, wherein a gate terminal of the fourth P-type transistor is configured to receive the inverted input voltage.

4. The level shifter of claim 3, wherein the third N-type transistor and the fourth N-type transistor are controlled to be turned on by the bias voltage, when the input voltage is pulled up from the third reference voltage to the first reference voltage, the first N-type transistor is turned on, the third P-type transistor is turned off, the second N-type transistor is turned off, the fourth P-type transistor is turned on, a voltage on the drain terminal of the first N-type transistor is pulled down to turn on the second P-type transistor, the second shifted voltage is pulled up to the second reference voltage, and a voltage on the drain terminal of the second N-type transistor is pulled up to turn off the first P-type transistor.

5. The level shifter of claim 4, wherein when the input voltage is pulled down from the first reference voltage to the third reference voltage, the first N-type transistor is turned off, the third P-type transistor is turned on, the second N-type transistor is turned on, the fourth P-type transistor is turned off, the voltage on the drain terminal of the second N-type transistor is pulled down to turn on the first P-type transistor, the first shifted voltage is pulled up to the second reference voltage, and the voltage on the drain terminal of the first N-type transistor is pulled up to turn off the second P-type transistor.

6. The level shifter of claim 3, wherein a pull-up current of each of the third P-type transistor and the fourth P-type transistor is less than a pull-down current of each of the first N-type transistor and the second N-type transistor.

7. The level shifter of claim 6, wherein the pull-up current is minimized by minimizing channel widths of the third P-type transistor and the fourth P-type transistor and maximizing channel lengths of the third P-type transistor and the fourth P-type transistor according to a design rule of a semiconductor process which is utilized for manufacturing the level shifter.

8. The level shifter of claim 1, wherein when the input voltage is pulled up from the third reference voltage to the first reference voltage, the cross-coupled voltage on the drain terminal of the first N-type transistor is pulled down to the third reference voltage, and the cross-coupled voltage on the drain terminal of the second N-type transistor is pulled up from the third reference voltage to the second reference voltage minus the N-type threshold voltage, making the first shifted voltage on the drain terminal of the third N-type transistor pulled down from the second reference voltage to the third reference voltage and the second shifted voltage on the drain terminal of the fourth N-type transistor pulled up from the third reference voltage to the second reference voltage.

9. The level shifter of claim 1, further comprising:

a buffer, configured to be driven by either the first shifted voltage or the second shifted voltage to generate the output voltage of the level shifter.

10. A level shifter, comprising:

an inverter, configured to invert an input voltage of the level shifter to generate an inverted input voltage based on a first reference voltage;

a first N-type transistor, wherein a gate terminal of the first N-type transistor is configured to receive the input voltage, and a source terminal of the first N-type transistor is coupled to a third reference voltage;

a second N-type transistor, wherein a gate terminal of the second N-type transistor is configured to receive the inverted input voltage, and a source terminal of the second N-type transistor is coupled to the third reference voltage;

a third N-type transistor, wherein a source terminal of the third N-type transistor is coupled to a drain terminal of the first N-type transistor, and a gate terminal of the third N-type transistor is configured to receive a bias voltage;

a fourth N-type transistor, wherein a source terminal of the fourth N-type transistor is coupled to a drain terminal of the second N-type transistor, and a gate terminal of the fourth N-type transistor is configured to receive the bias voltage;

a first P-type transistor, wherein a gate terminal of the first P-type transistor is coupled to the drain terminal of the second N-type transistor, a drain terminal of the first P-type transistor is coupled to a drain terminal of the third N-type transistor, and a source terminal of the first P-type transistor is configured to receive a second reference voltage;

a second P-type transistor, wherein a gate terminal of the second P-type transistor is coupled to the drain terminal of the first N-type transistor, a drain terminal of the second P-type transistor is coupled to a drain terminal of the fourth N-type transistor, and a source terminal of the second P-type transistor is configured to receive the second reference voltage;

a fifth P-type transistor, wherein a gate terminal of the fifth P-type transistor is coupled to a drain terminal of the fifth P-type transistor, and a source terminal of the fifth P-type transistor is configured to receive the second reference voltage;

at least one sixth P-type transistor, coupled between the drain terminal of the fifth P-type transistor and the drain terminal of the first N-type transistor; and at least one seventh P-type transistor, coupled between the drain terminal of the fifth P-type transistor and the drain terminal of the second N-type transistor;

wherein a gate terminal of the at least one sixth P-type transistor is coupled to the drain terminal of the second N-type transistor, and a gate terminal of the at least one seventh P-type transistor is coupled to the drain terminal of the first N-type transistor;

wherein the level shifter generates an output voltage according to either a first shifted voltage on the drain terminal of the third N-type transistor or a second shifted voltage on the drain terminal of the fourth N-type transistor.

11. The level shifter of claim 10, wherein a first pull-up current of each of the first P-type transistor and the second P-type transistor plus a second pull-up current of each of the at least one sixth P-type transistor and the at least one seventh P-type transistor is less than a pull-down current of each of the first N-type transistor and the second N-type transistor.

12. The level shifter of claim 11, wherein the second pull-up current is minimized by minimizing channel widths of the at least one sixth P-type transistor and the at least one seventh P-type transistor and maximizing channel lengths of the at least one sixth P-type transistor and the at least one seventh P-type transistor according to a design rule of a semiconductor process which is utilized for manufacturing the level shifter.

13. The level shifter of claim 10, wherein sizes of the fifth P-type transistor, the first P-type transistor and the second P-type transistor are identical.

14. The level shifter of claim 10, wherein an upper bound of a cross-coupled voltage on each of the drain terminals of the first N-type transistor and the second N-type transistor is controlled according to the second reference voltage and a P-type threshold voltage of the fifth P-type transistor.

15. The level shifter of claim 14, wherein the upper bound of the cross-coupled voltage is equal to the second reference voltage minus the P-type threshold voltage.

16. The level shifter of claim 15, wherein when the input voltage is pulled up from the third reference voltage to the first reference voltage, the cross-coupled voltage on the drain terminal of the first N-type transistor is pulled down from the second reference voltage minus the P-type threshold voltage to the third reference voltage, and the cross-coupled voltage on the drain terminal of the second N-type transistor is pulled up from the third reference voltage to the second reference voltage minus the P-type threshold voltage, making the first shifted voltage on the drain terminal of the third N-type transistor pulled down from the second reference voltage to the third reference voltage and the second shifted voltage on the drain terminal of the fourth N-type transistor pulled up from the third reference voltage to the second reference voltage.

17. The level shifter of claim 1, further comprising:
a third P-type transistor, coupled between a drain terminal of the first P-type transistor and the drain terminal of the third N-type transistor, wherein a gate terminal of the third P-type transistor is configured to receive the input voltage;
a fourth P-type transistor, coupled between a drain terminal of the second P-type transistor and the drain terminal of the fourth N-type transistor, wherein a gate terminal of the fourth P-type transistor is configured to receive the inverted input voltage;
a fifth P-type transistor, wherein a gate terminal of the fifth P-type transistor is coupled to a drain terminal of the fifth P-type transistor, and a source terminal of the fifth P-type transistor is configured to receive the second reference voltage;
at least one sixth P-type transistor, coupled between the drain terminal of the fifth P-type transistor and the drain terminal of the first N-type transistor; and
at least one seventh P-type transistor, coupled between the drain terminal of the fifth P-type transistor and the drain terminal of the second N-type transistor;
wherein a gate terminal of the at least one sixth P-type transistor is coupled to the drain terminal of the second N-type transistor, and a gate terminal of the at least one seventh P-type transistor is coupled to the drain terminal of the first N-type transistor.

* * * * *